US012807481B2

(12) United States Patent
Sevilla et al.

(10) Patent No.: US 12,807,481 B2
(45) Date of Patent: Nov. 24, 2026

(54) TEMPERATURE STABILIZATION OF MICRO ELECTROMECHANICAL SYSTEM SENSORS FOR ANTENNA MONITORING DEVICES

(71) Applicant: Viavi Solutions Inc., Chandler, AZ (US)

(72) Inventors: Thomas Sevilla, Miramar, FL (US); Raleigh B. Stelle, IV, Indiannapolis, IN (US)

(73) Assignee: Viavi Solutions Inc., Chandler, AZ (US)

( * ) Notice: Subject to any disclaimer, the term of this patent is extended or adjusted under 35 U.S.C. 154(b) by 537 days.

(21) Appl. No.: 18/456,222

(22) Filed: Aug. 25, 2023

(65) Prior Publication Data

US 2025/0066187 A1 Feb. 27, 2025

(51) Int. Cl.
*B81B 7/00* (2006.01)

(52) U.S. Cl.
CPC ...... *B81B 7/0087* (2013.01); *B81B 2201/025* (2013.01); *B81B 2207/012* (2013.01); *B81B 2207/11* (2013.01)

(58) Field of Classification Search
None
See application file for complete search history.

(56) References Cited

U.S. PATENT DOCUMENTS

2012/0197554 A1* 8/2012 Glaudel ................ G01L 9/0072 73/718

* cited by examiner

*Primary Examiner* — Kyoung Lee
(74) *Attorney, Agent, or Firm* — DLA PIPER LLP US

(57) ABSTRACT

Temperature stabilization systems and methods for MEMS sensors are disclosed. In an example, a temperature stabilization system may include heating and or cooling components within a printed circuit board (PCB) that holds a MEMS sensor. For example, a resistance heating wire can be used as a heating component and a Peltier device may be used as a heating and or a cooling component. Temperature sensors may be placed on the MEMS sensor itself and or the external environment and the measurements from the temperature sensors can be used to run a feedback loop to the keep the MEMS sensors within a desired temperature range through the use of the heating and or the cooling components.

18 Claims, 7 Drawing Sheets

100

200a

200b

300a

300b

300c

400

TEMPERATURE STABILIZATION OF MICRO ELECTROMECHANICAL SYSTEM SENSORS FOR ANTENNA MONITORING DEVICES

BACKGROUND

Modern communication systems rely heavily on wireless signals transmitted and received by antennas. On the transmit side, antennas receive fluctuating electrical currents through wires from connected circuitry and generate wireless signals as electromagnetic fields corresponding to the fluctuating electrical currents. On the receive side, antennas convert electromagnetic fields of received wireless signals to electrical currents carried through wires to the connected circuitry. Because of directional oscillation of electrical and magnetic fields, wireless signaling through the transmittal and receipt of electromagnetic fields is inherently directional—heavily influenced by the location of the signal source, multipathing, beamforming, and or other aspects associated with electromagnetic fields and electromagnetic radiation. Therefore, for an optimal bandwidth and signal strength, antennas—both on the transmit and receive sides—may require precise alignments and tuning with respect to each other.

Antenna monitoring devices are generally used for supervision of physical antenna attributes such as azimuth, tilt and or roll, which can be used to aid in alignment or tuning of antennas. An antenna monitoring device is generally an electronic device that is mounted (typically permanently) on the antenna or a structure supporting the antenna. Within the antenna monitoring device, electronic and magnetic components measure antenna tuning parameters and or a directional alignment of the antenna in terms of antenna roll, tilt, and or azimuth. Feedback provided by the antenna monitoring device, e.g., through an interface, may be used to tune the antenna and or adjust the alignment of the antenna to a desired roll, tilt, and or azimuth.

Micro electromechanical system (MEMS) sensors are used to measure the roll and tilt of the antenna monitoring devices (and vicariously the antenna itself) by measuring the gravity vector. MEMS sensors are typically based on microelectronic chips that have mechanical portions such as springs changed by the gravity vector. The change in the mechanical portions is captured electronically, e.g., a mechanical movement can be electronically captured as a change in capacitance and the change in capacitance can be processed to determine the orientation of a sensor vis-à-vis the gravity vector.

A major problem with the MEMS sensors is temperature drift because temperature also affects the mechanical portions of the sensors. For example, excess heat may expand the spring and excess cold may contract the spring. The reading from the sensors may therefore drift or otherwise be inaccurate based on the changes in temperature. For instance, a change in capacitance due to temperature may be read as a change in the orientation of the sensor. This problem is especially acute for the antenna monitoring devices that are deployed in the external environment.

As such, a significant improvement in deploying MEMS sensors in antenna monitoring devices is desired.

SUMMARY

Embodiments disclosed herein solve the aforementioned technical problems and may provide other solutions as well. In one or more embodiments, temperature stabilization systems and methods for MEMS sensors are disclosed. In an example, a temperature stabilization system may include heating and or cooling components within a printed circuit board (PCB) that holds a MEMS sensor. For example, a resistance heating wire can be used as a heating component and a Peltier device may be used as a heating and or a cooling component. Temperature sensors may be placed on the MEMS sensor itself and or the external environment and the measurements from the temperature sensors can be used to run a feedback loop to the keep the MEMS sensors within a desired temperature range through the use of the heating and or the cooling components.

In one or more embodiments, a system for stabilizing temperature of a MEMS sensor deployed to an antenna monitoring device is provided. The system may include a temperature regulating device placed in thermal coupling with the MEMS sensor. The system may also include a temperature sensor configured to measure a temperature associated with the MEMS sensor. The system may further include a processor configured to cause the temperature regulating device to heat or cool the MEMS sensor based on the measured temperature.

In one or more embodiments, a method of stabilizing temperature of a MEMS sensor deployed to an antenna monitoring device is provided. The method may include measuring, by a temperature sensor, a temperature associated with the MEMS sensor. The method may also include executing, by a processor of the antenna monitoring device, a control loop based on the measured temperature to control operation of a temperature regulating device. The method may further include heating or cooling, by the temperature regulating device, the MEMS sensor using the executed control loop.

It should be understood that this summary just provides example embodiments for a quick introduction of the disclosure and should not be considered limiting.

It should be understood that the drawings are just for illustrating the principles disclosed herein and should not be considered limiting.

DETAILED DESCRIPTION OF SEVERAL EMBODIMENTS

Embodiments disclosed herein may temperature stabilize MEMS sensors deployed on an antenna monitoring device.

Temperature regulating devices may be provided abutting or thermally coupled to the MEMS sensors. Example temperature regulating devices may include heating coils, Peltier devices, and or the like. The temperature regulating devices may be controlled by a processor of the antenna monitoring device. The processor may execute a control loop based on temperature measured by one or more temperature sensors. The temperature sensors may be within the MEMS sensors or external but thermally coupled to the MEMS sensors, or they may be ambient temperature sensors. Using the executed control loop, the temperature regulating devices may maintain a desired temperate range for the MEMS sensors.

Figure 1:
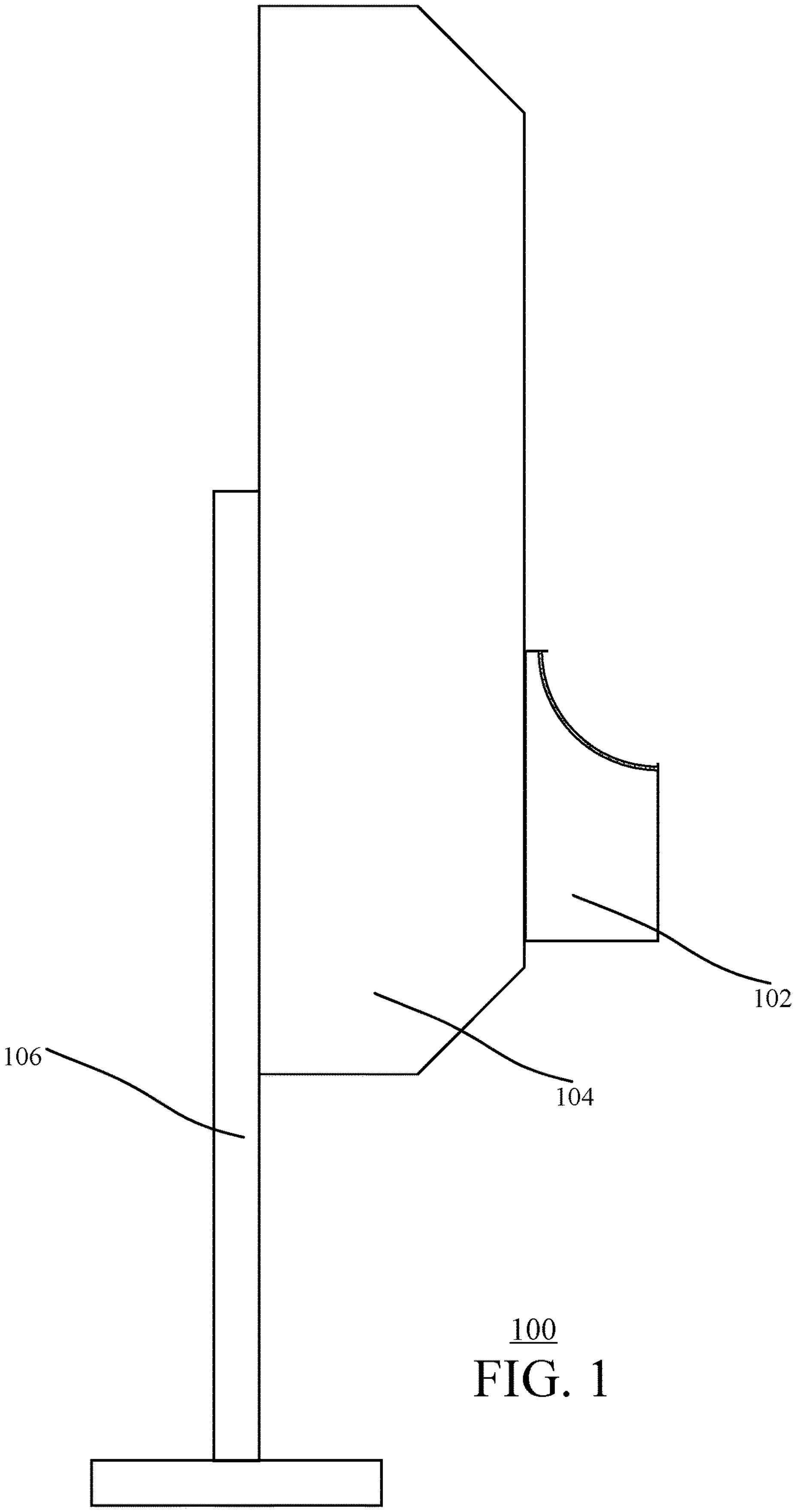
FIG. 1 shows an example environment for antenna monitoring, based on the principles disclosed herein.

FIG. 1 shows an example environment 100 for antenna monitoring, based on the principles disclosed herein. The example environment 100 includes an antenna 104, which may be disposed on a support structure 106. The shown support structure 106 is just an example, and the antenna 104 may be located on any type of suitable support structure such as e.g., an antenna tower, rooftop, treetop, building wall, vehicle top, satellite, and or the like. Furthermore, the antenna 104 can be any type of antenna, including a dome antenna, a sector antenna, a microwave antenna, an omni-directional antenna, a loop antenna, a multibeam antenna, a Yagi-type antenna, and or any type of antenna that may have to have a consistent alignment for optimal performance. In one or more embodiments, the antenna 104 may be a part of a cellular telephony network such as $5^{th}$ generation mobile network (5G). More particularly, the antenna 104 may be a part of a base station of the cellular telephony network.

An antenna monitoring device 102 may be used for monitoring the antenna 104. For example, the antenna monitoring device 102 may output alignment information such as roll, tilt, and or azimuth. Using the alignment information, a user may monitor the antenna 104 to determine whether it has maintained a desired roll, tilt, and or azimuth. For example, the antenna monitoring device 102 may upload the monitored parameters (e.g., roll, tilt, and or azimuth) to a remote device (e.g., a cloud server), which may then be accessed to determine whether the antenna 104 has maintained its desired alignment. As used herein, antenna monitoring parameters may include antenna alignment parameters (e.g., roll, tilt, and or azimuth) and or any type of antenna tuning parameters.

To measure roll and tilt, the antenna monitoring device 102 may use one or more MEMS sensors. These MEMS sensors, as described below in reference to FIGS. 2A-2B and 3A-3C, are within a printed circuit board (PCB) of the antenna monitoring device 102. The operation of the MEMS sensors is known in the art, and therefore will not be described in detailed here. At a high level, a MEMS sensor translates a mechanical effect to an electronic signal. For example, a movable spring can be disposed in between other components, and when the spring moves in relation to the other components, e.g., due to the gravity vector, a capacitance between the spring and the other components changes. The changed capacitance can be processed electronically to determine the roll and the tilt of the device in relation to the earth's surface.

Several example techniques may be used to mitigate the effect of temperature on the MEMS sensors. These techniques may be used to maintain a desired operating temperature range for the MEMS sensors. In one or more embodiments, a feedback loop with a one or more temperature sensors, and one or more heating and or cooling components may be used.

Figure 2A:
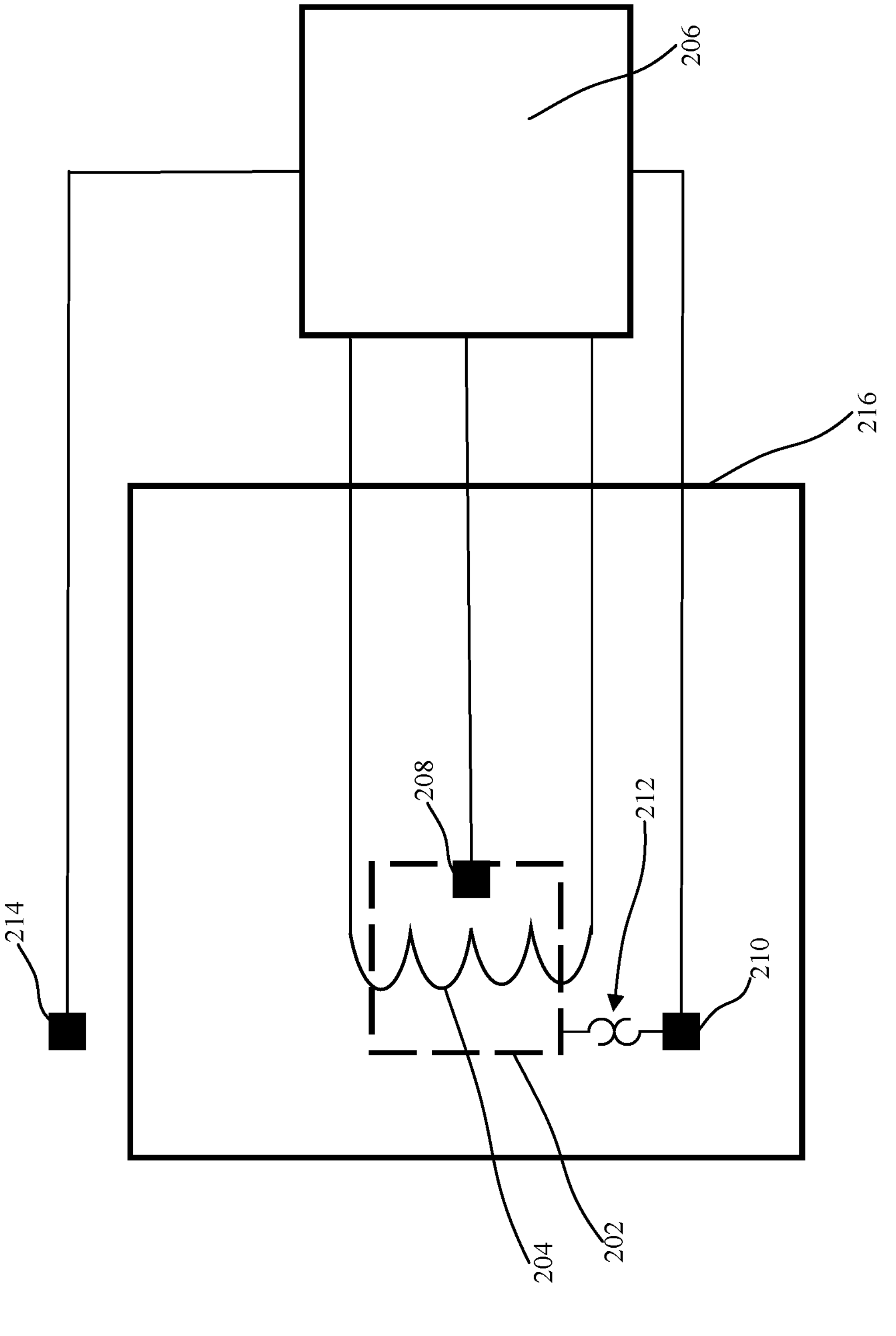
FIG. 2A shows an example temperature stabilization system for MEMS sensors based on the principles disclosed herein.

FIG. 2A shows an example temperature stabilization system 200*a* for MEMS sensors based on the principles disclosed herein. As shown, the temperature stabilization system 200*a* may be used to maintain an operating temperature range for a MEMS sensor 202. It should be understood that the shown components of the temperature stabilization system 200*a* are merely intended as examples and should not be considered limiting. That is, temperature stabilization systems with additional, alternate, or fewer number of components should be considered within the scope of this disclosure.

The temperature stabilization system 200*a* may use a heating coil 204 to heat the MEMS sensor 202, which is located on a PCB 216. Heat generation of the heating coil 204 may be controlled by a processor 206 such as a main processor of an antenna monitoring device. The illustrated and relative size and structure of the heating coil 204 are just examples and should not be considered limiting. The processor may receive a temperature measured by one or more of the temperature sensors 208, 210, 214, and control heating coil 204 based on the received temperature. As shown, one temperature sensor 208 may be internal to the MEMS sensor 202 itself, a second temperature sensor 210 may on the PCB 216 but with a thermal coupling 212 to the MEMS sensor 202, and a third temperature sensor 214 may be outside the PCB measuring an ambient temperature. Non-limiting examples of the temperature sensors 208, 210, 214 may include thermistors, temperature sensing integrated circuits (ICs), and or any other electronic, electromechanical, chemical, or electrochemical temperature sensor.

In some embodiments, the temperature sensors 208, 210, 214 may be used as complementary temperature sensors where the processor 206 may use temperature measurements from all the temperature sensors 208, 210, 214 to control the heating coil 204. In other embodiments, the temperature sensors 208, 210, 214 may be used as alternates. For example, if it is not feasible to have the temperature sensor 208 on the MEMS sensor 202 itself, temperature sensor 210 and or temperature sensor 214 may be used for approximating the temperature of the MEMS sensor 202.

Regardless of the location of the temperature sensors 208, 210, 214, a feedback control loop may be formed by one or more of the temperature sensors 208, 210, 214, the processor 206, and the heating coil 204. In one or more embodiments, the control loop may be a proportional-integral-derivative (PID) control loop. In one or more embodiments, the control loop may be a model predictive control (MPC) loop. Operations of PID and MPC controllers are well known in the art and therefore will not be described in detail herein. In one or more embodiments, a simpler controller (e.g., a programmable electronic circuit) may be used instead of the processor 206. In all of these embodiments, the feedback loop may maintain a desired temperature by selectively (i.e., at different times) generating heat at the heating coil 204.

The heating coil 204 may be placed at any location. For example, the heating coil 204 may be placed on the top of the MEMS sensor 202. In another example, the heating coil 204 may be placed at the bottom of the MEMS sensor 202. In yet another example, the heating coil 204 may be placed on the side of the MEMS sensor 202. In one or more embodiments, multiple heating coils may be used for a single MEMS sensor. Alternatively, a single heating coil may be used for multiple MEMS sensors. Therefore, any arrangement of the heating coils and the MEMS sensors should be considered within the scope of this disclosure.

Figure 2B:
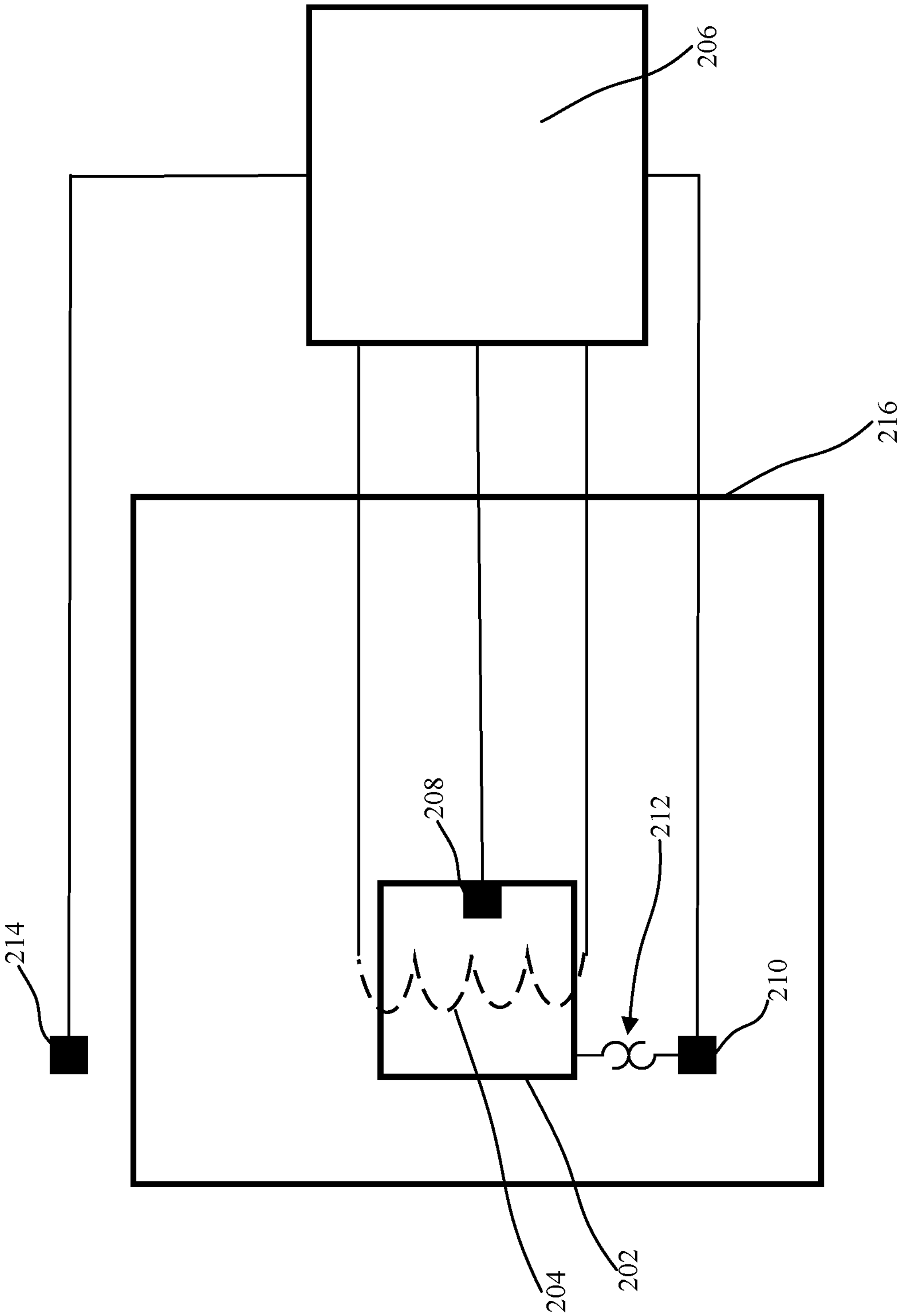
FIG. 2B shows an example temperature stabilization system for MEMS sensors based on the principles disclosed herein.

FIG. 2B shows an example temperature stabilization system 200*b* for MEMS sensors based on the principles disclosed herein. The temperature stabilization system 200*b* is similar to the temperature stabilization system 200*a*, except that the heating coil 204 is below the MEMS sensor 202. In one or more embodiments, the heating coil 204 may be on the opposite side of the PCB 216 than the MEMS sensor 202. In one or more embodiments, the heating coil 204 may be printed on the PCB 216 itself. The printed heating coil 204 may be on the side of the PCB 216 that has the MEMS sensor 202 (i.e., the heating coil 204 may be printed to be directly below the MEMS sensor 202) or on the opposite side of the PCB 216.

Figure 3A:
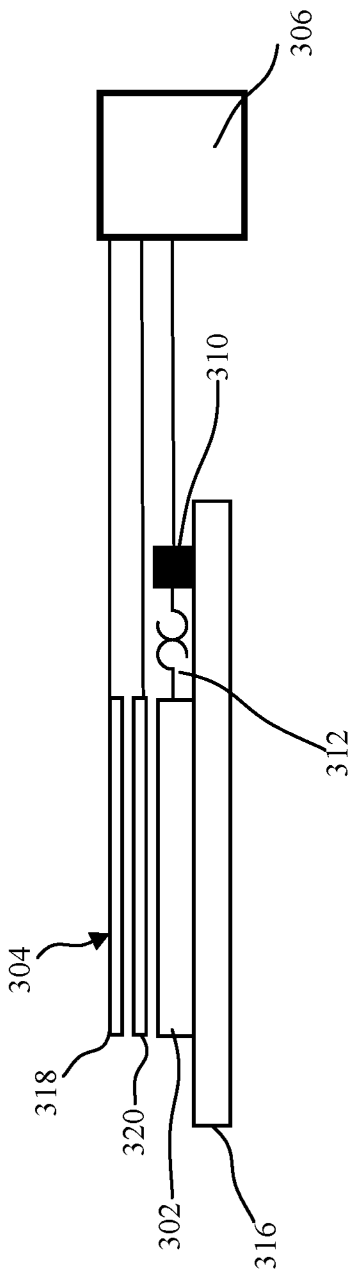
FIG. 3A shows an example temperature stabilization system for MEMS sensors based on the principles disclosed herein.

FIG. 3A shows an example temperature stabilization system 300*a* for MEMS sensors based on the principles disclosed herein. As shown, the temperature stabilization system 300*a* may be used to maintain an operating temperature range for a MEMS sensor 302. It should be understood that the illustrated components of the temperature stabilization system 300*a* are merely intended as examples and should not be considered limiting. That is, temperature stabilization systems with additional, alternate, or fewer number of components should be considered within the scope of this disclosure.

The illustrated temperature stabilization system 300*a* may use a Peltier device 304 to maintain a desired temperature range for the MEMS sensor 302. Peltier devices are well known in the art and will not be described in detail herein. Generally, the Peltier device 304 includes a cold side 318 and a hot side 320, and when electricity passes through the Peltier device 304, the cold side 318 gets cooler and the hot side 320 gets hotter. As shown, the hot side 320 may abut the MEMS sensor 302, thereby heating the MEMS sensor 302 as needed.

To control the heating operation of the Peltier device 304, a temperature sensor 310 having a thermal coupling 312 to the MEMS sensor 302 may be used. The illustrated location of the temperature sensor 310 is an example and temperature sensors directly on the MEMS sensor 302 and or on the outside environment may be used. The temperature sensor 310 may be connected to a processor 306 (e.g., processor of the antenna monitoring device), which in turn may control the operation (e.g., by controlling the amount of electricity) of the Peltier device 304. As described above in reference to FIGS. 2A-2B, the processor 306, the temperature sensor 310, and the Peltier device 304 may form a feedback loop (e.g., a PID or MPC) to maintain a desired temperature on the MEMS sensor 302.

In one or more embodiments, the Peltier device 304 itself may function as a temperature sensor. For instance, when the Peltier device 304 is not being used to heat (or cool as described below) the MEMS sensor 302, the electrical current measurements at the Peltier device may be used to calculate the temperature of the Peltier device 304 using techniques known in the art.

Figure 3B:
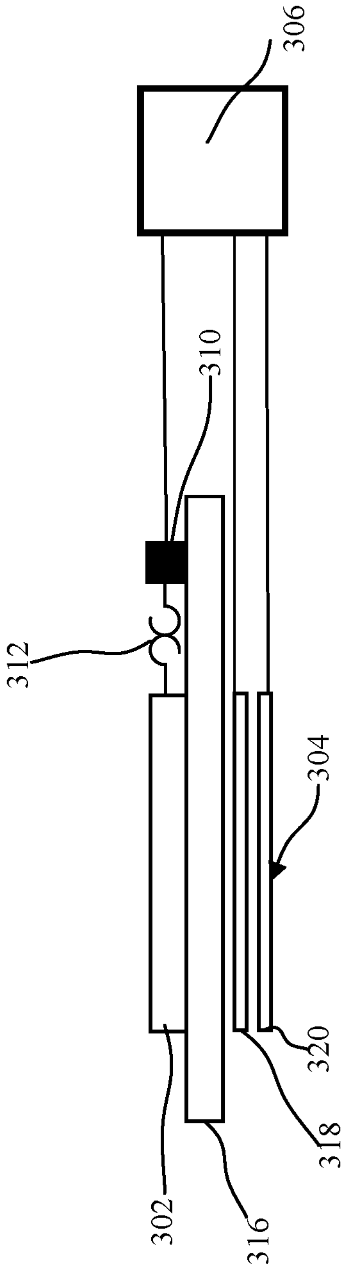
FIG. 3B shows an example temperature stabilization system for MEMS sensors based on the principles disclosed herein.

FIG. 3B shows another example temperature stabilization system 300*b* for MEMS sensors based on the principles disclosed herein. The illustrated stabilization system 300*b* is similar to the system 300*a* shown in FIG. 3A except that the Peltier device 304 is below the PCB 316 in system 300*b*. The system 300*b* may thereby allow the Peltier device 304 to cool the MEMS sensor 302 as the cold side 318 abuts the PCB at a portion directly below the MEMS sensor 302.

Figure 3C:
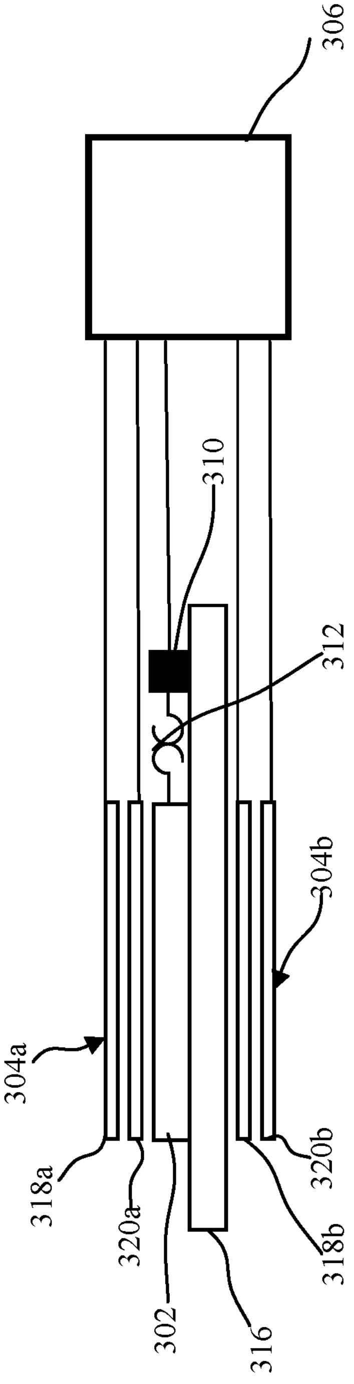
FIG. 3C shows an example temperature stabilization system based on the principles disclosed herein.

FIG. 3C illustrates another example temperature stabilization system 300*c* based on the principles disclosed herein. The shown stabilization system 300*c* is similar to the system 300*b* shown in FIG. 3B and the system 300*a* shown in FIG. 3A. The system 300*c* is different because it includes a first Peltier device 304*a* on top of the MEMS sensor 302 and a second Peltier device 304*b* at the bottom of the PCB 316 below the MEMS sensor 302. For the first Peltier device 304*a*, a hot side 320*a* abuts the MEMS sensor 302 while a cold side 318*a* is away from the MEMS sensor 302. For the second Peltier device 304*b*, a cold side 318*b* abuts the MEMS sensor 302 (i.e., through the PCB) while the hot side 320*b* is away from the MEMS sensor 302. Therefore, the processor 306 can selectively control corresponding currents passing through the Peltier devices 304*a*, 304*b* to maintain a desired temperature range for the MEMS sensor 302. The selective control of the corresponding currents may be based on the temperature measured by the temperature sensor 310.

The illustrated Peltier devices, 304, 304*a*, 304*b* abutting the MEMS sensor 302 or the PCB 316 directly below the MEMS sensor 302 are just examples for carrying out the disclosed principles. For example, in one or more embodiments, the Peltier devices 304, 304*a*, 304*b* may not necessarily abut the MEMS sensor 302, but may be thermally coupled to the MEMS sensor 302 e.g., by using copper traces (not shown) within the PCB 316. Therefore, any kind of heat exchange mechanism between the Peltier devices 304, 304*a*, 304*b* and the MEMS sensor 302 should be considered within the scope of this disclosure.

It should be understood that the above described heating and cooling components are merely provided as examples and should not be considered limiting. Other examples of heating and cooling components may be used to regulate the temperature of the MEMS sensors based on the principles disclosed herein. For example, heating and/or cooling components may use vapor-liquid based cooling or heating. That is, a fluid may circulate through a pipe abutting (or thermally coupled to) the MEMS sensors, and compressors and valves may be used to change the state of the fluid such as gas→liquid or liquid→gas. The heat dissipated in these processes may be used to heat the MEMS sensors, while the heat absorbed in these processes may be used to cool the MEMS sensors. In addition to these methods, any other type of thermal, thermochemical, mechanical, and or electromechanical process to generate or absorb heat at the vicinity of the MEMS sensors should be considered within the scope of this disclosure.

Figure 4:
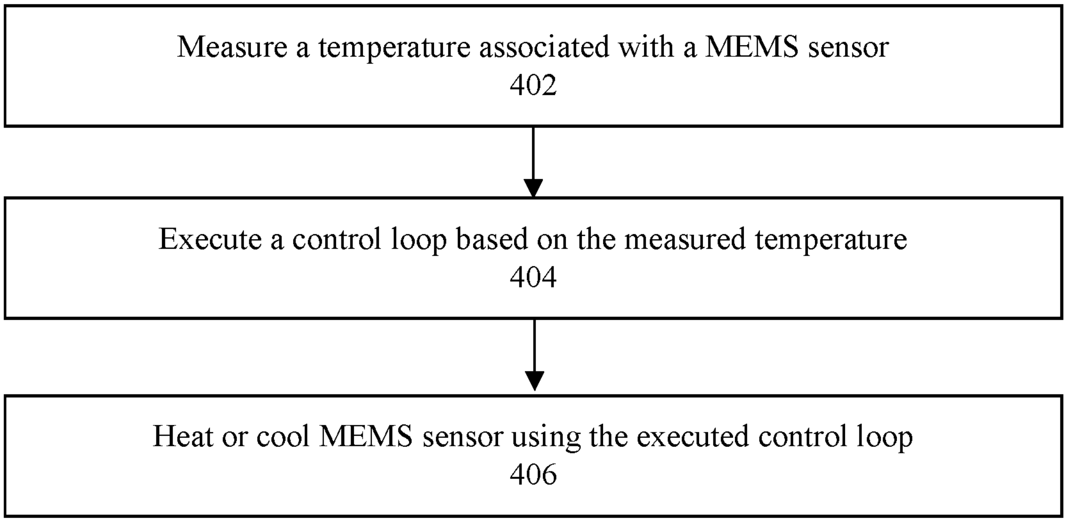
FIG. 4 shows a flow diagram of an example method of stabilizing temperature of a MEMS sensor deployed to an antenna alignment device based on the principles disclosed herein.

FIG. 4 shows a flow diagram of an example method 400 of stabilizing temperature of a MEMS sensor deployed to an antenna alignment device based on the principles disclosed herein. It should be understood that steps of the method 400 shown in FIG. 4 and described herein are merely examples and should not be considered limiting. Methods with additional, alternate, or fewer number of steps should be considered within the scope of this disclosure.

The method 400 begins at step 402, where a temperature associated with a MEMS sensor may be measured. In one or more embodiments, the temperature may be measured by temperature sensors that are external, but thermally coupled to the MEMS sensors. Examples of the external and thermally coupled temperatures include memristors, temperature sensors (IC), and or the like. In one or more embodiments, the temperature may be measured by an ambient temperature sensor without a thermal coupling to the MEMS sensor, and the ambient temperature may be used as an approximation of the MEMS sensor temperature. In one or more embodiments, the temperature sensor may be internal to the MEMS sensor. In one or more embodiments, a Peltier device may function as the temperature sensor.

At step 404, a control loop may be executed based on the measured temperature. In one or more embodiments, the control loop may be executed by a processor of the antenna monitoring device to control an operation of a temperature regulating device. In one or more embodiments, the control loop may include a PID control loop. In one or more embodiments, the control loop may include a MPC control loop.

At step 406, the MEMS sensor may be heated or cooled using the executed control loop. That is, the temperature regulating device may generate heat or extract heat under the control of the processor. The temperate regulating device may include a heating coil, a Peltier device, and or the like as described above. The control loop may ensure that the temperature regulating device keeps the MEMS sensor at a desired operating temperature range, which, as noted above, was not satisfactorily obtainable with other known systems and methods.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A system for stabilizing temperature of a micro electromechanical system (MEMS) sensor deployed to an antenna monitoring device, the system comprising:

a temperature regulating device thermally coupled with the MEMS sensor, the temperature regulating device comprising a heating coil configured to heat the MEMS sensor;

a temperature sensor configured to measure a temperature associated with the MEMS sensor; and a processor configured to cause the temperature regulating device to heat or cool the MEMS sensor based on the measured temperature.

2. The system of claim 1, the heating coil being placed on top of the MEMS sensor.

3. The system of claim 1, the heating coil being placed below a portion of a printed circuit board (PCB) containing the MEMS sensor.

4. The system of claim 1, the heating coil being printed on a PCB containing the MEMS sensor.

5. The system of claim 1, the temperature sensor comprising an external thermistor thermally coupled with the MEMS sensor.

6. The system of claim 1, the temperature sensor comprising an external internal integrated circuit thermally coupled with the MEMS sensor.

7. The system of claim 1, the temperature sensor being placed internally within the MEMS sensor.

8. A system for stabilizing temperature of a micro electromechanical system (MEMS) sensor deployed to an antenna monitoring device, the system comprising:

a temperature regulating device thermally coupled with the MEMS sensor, the temperature regulating device comprising a Peltier device configured to heat or cool the MEMS sensor;

a temperature sensor configured to measure a temperature associated with the MEMS sensor; and a processor configured to cause the temperature regulating device to heat or cool the MEMS sensor based on the measured temperature.

9. The system of claim 8, the Peltier device being placed on top of the MEMS sensor.

10. The system of claim 8, the Peltier device being placed below a portion of a PCB containing the MEMS sensor.

11. The system of claim 8, the Peltier device being configured to operate as the temperature sensor.

12. The system of claim 8, the Peltier device being thermally coupled with the MEMS sensor using copper traces on a PCB containing the MEMS sensor.

13. The system of claim 8, the Peltier device comprising a first Peltier device being placed on top of the MEMS sensor and a second Peltier device being placed below a portion of a PCB containing the MEMS sensor.

14. A method of stabilizing temperature of a micro electromechanical system (MEMS) sensor deployed to an antenna monitoring device, the method comprising:

measuring, by a temperature sensor, a temperature associated with the MEMS sensor;

executing, by a processor of the antenna monitoring device, a control loop to control operation of a temperature regulating device based on the measured temperature;

heating or cooling, by the temperature regulating device, the MEMS sensor using the executed control loop;

measuring, by the MEMS sensor, earth's gravity vector; and determining, by the processor, a roll and tilt of an antenna coupled to the antenna monitoring device based on the measured earth's gravity vector.

15. The method of claim 14, the control loop comprising a proportional-integral-derivative (PID) control loop.

16. The method of claim 14, the control loop comprising a model predictive control (MPC) loop.

17. The method of claim 14, the temperature regulating device comprising at least one of a heating coil or a Peltier device.

18. The method of claim 14, the temperature sensor comprising at least one of an external thermistor placed in thermal coupling with the MEMS sensor, an external internal integrated circuit placed in thermal coupling with the MEMS sensor, an ambient temperature sensor, or a temperature sensor being placed internally within the MEMS sensor.

* * * * *